United States Patent [19]

Straub et al.

[11] Patent Number: 4,473,964
[45] Date of Patent: Oct. 2, 1984

[54] COMPETITION FIREARM

[75] Inventors: Dieter Straub, Ulm; Karl Hoffmann, New-Ulm, both of Fed. Rep. of Germany

[73] Assignee: J. G. Anschutz GmbH, Ulm, Fed. Rep. of Germany

[21] Appl. No.: 359,484

[22] Filed: Mar. 18, 1982

[30] Foreign Application Priority Data

Mar. 20, 1981 [DE] Fed. Rep. of Germany ....... 3111081

[51] Int. Cl.³ ............................................. F41B 11/00
[52] U.S. Cl. .................................... 42/75 A; 42/75 C; 124/68; 384/222
[58] Field of Search ................... 42/1 V, 75 A, 75 C; 124/68; 42/75 B; 384/222, 300

[56] References Cited

U.S. PATENT DOCUMENTS

| 2,159,327 | 5/1939 | Hendrick | 384/222 |
| 2,223,872 | 12/1940 | McWhorter et al. | 384/222 |
| 2,295,139 | 9/1942 | Topanelian, Jr. | 384/222 |
| 2,967,368 | 1/1961 | Williams | 42/754 |
| 3,171,699 | 3/1965 | Maxey | 384/222 |

FOREIGN PATENT DOCUMENTS

| 1140489 | 9/1967 | Fed. Rep. of Germany . | |
| 1147142 | 6/1968 | Fed. Rep. of Germany . | |
| 2329425 | 1/1975 | Fed. Rep. of Germany | 124/68 |
| 2512476 | 9/1976 | Fed. Rep. of Germany | 124/68 |

*Primary Examiner*—Charles T. Jordan
*Assistant Examiner*—Ted L. Parr
*Attorney, Agent, or Firm*—Holman & Stern

[57] ABSTRACT

A recoilless competition rifle or competition pistol with an action which is mounted and guided in the firearm so as to be longitudinally displaceable on bearings and which returns during firing. The bearings have special beddings which compensate for deviations of the bearing axes from their ideal desired positions by adapting their shape to the particular conditions. Bearings made of elastic materials provide for a reversible displacement of material. Beddings comprise materials which can be poured or kneaded and which then solidify in situ to assume their final form as a result of direct shaping (initial shaping) on the delimiting surfaces.

10 Claims, 5 Drawing Figures

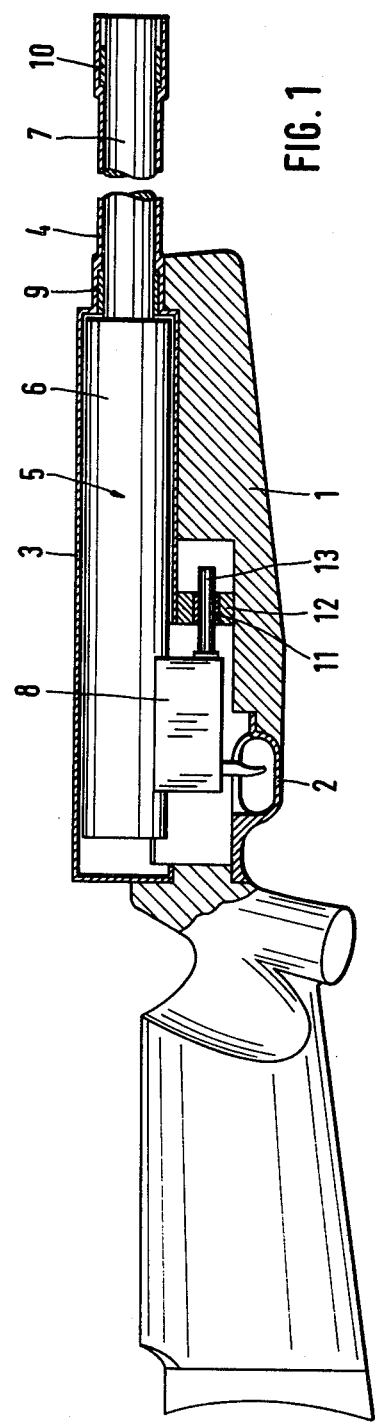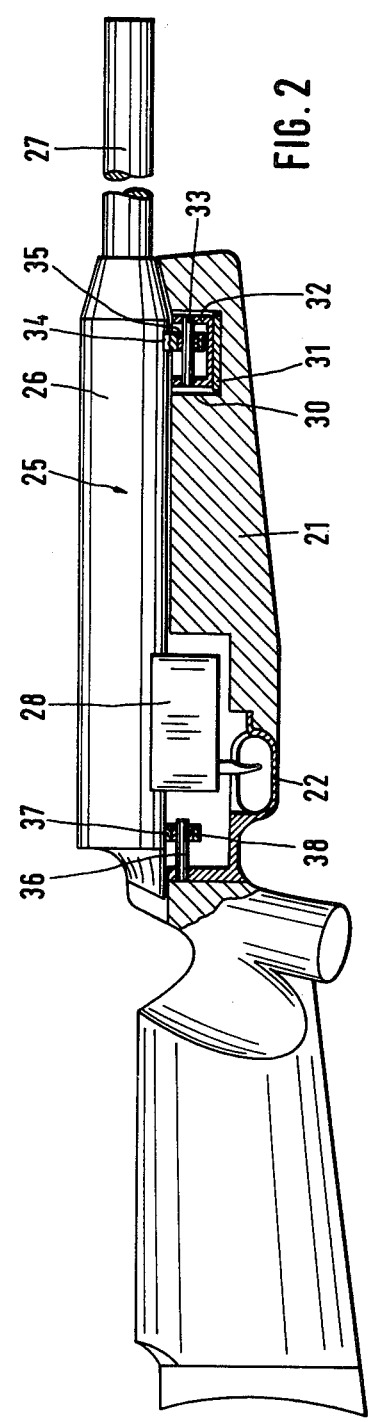

COMPETITION FIREARM

BACKGROUND OF THE INVENTION

1. Field of the Invention

The invention relates to a competition firearm, especially a rifle or pistol, having an action including a breech casing which is guided in the firearm so as to be longitudinally displaceable on bearings and which counteracts the recoil during firing and to which the barrel and other firearms parts are fastened, if appropriate, for the purpose of increasing weight. Competition firearms of this type are known as compressed-air firearms having a piston, cylinder and compression spring. In addition to this, however, they are also used as firearms for cartridge ammunition.

The action mounted displaceably in the firearm is moved, during firing, as a result of the recoil in the direction opposite to the departing bullet. The bearings are designed and aligned so that they permit movement in this direction only. Consequently, the recoil cannot be transmitted to the action-carrying parts of the firearm (stock), and the latter is recoilless towards the outside. The recoil energy which is expressed in the kinetic energy of the action is used up by means of bearing friction and, if necessary, by means of a soft buffer which takes effect at the end of the return travel. The bearings in which the action runs are metallic plain or roller bearings which are fastened rigidly to the action and to the action-carrying firearm parts.

2. Description of the Prior Art

An example of a recoilless compressed-air firearm, the displaceable action of which is guided in at least two prismatic linear roller bearings arranged parallel in the stock, is given in German Patent Specification No. 1,140,489. The action of a recoilless shoulder weapon which has become known is also equipped with similar prismatic roller bearings.

In a recoilless compressed-air firearm according to German Patent Specification No. 1,147,142, the front end of the action on the barrel side is mounted by means of two cylindrical bolts arranged parallel to the longitudinal axis of the action and at a lateral distance from one another in two corresponding bores in a support fastened in the stock. As a result of the transverse distance between the bearing bolts, the action is prevented from tilting sideways. The rear end of the action is supported displaceably by means of an axis-parallel bore on a bolt fastened in the same line in the stock.

Another recoilless compressed-air firearm which is described in German Patent Specification No. 2,329,425 is also konw. In this firearm, an essentially cylindrical action to which the barrel is also fastened is mounted so as to be longitudinally displaceable, by means of cylindrical linear roller bearings arranged concentrically to the main axis, in a tubular metallic sleeve connected fixedly to the stock. A further bearing attached off-center to the action prevents the action from rotating about its main axis.

In all these firearms, it is necessary for the axes of movement of the action bearings to be aligned absolutely parallel or in one line. Moreover, if appropriate, the distances between the axes of the bearings and the distances between the parts mounted therein must correspond exactly. And finally, it is also necessary for the bearing geometry to have the appropriate accuracy. If these conditions are not satisfied, the bearings jam or cannot be assembled at all in the first place. Consequently, it is necessary either to ensure a high degree of accuracy in the production of the parts in question or to make the bearing play correspondingly large. The first is expensive and the other lowers the firing accuracy of the weapon, which is understandably undesirable.

However, the interaction of the various bearings is influenced adversely not only by dimensional and positional variations caused by production, but also by changes in position which do not arise until the firearm is used. Changes in position of this type can be caused, for example, by uneven fluctuations in temperature of the firearm parts, by mechanical loads and by variations of moisture in stocks made of wood or plastic which, under certain circumstances, also lead to distortions of the action bearings.

To mitigate these difficulties, an attempt was made to design at least one of the three action bearings as a so-called loose bearing which is insensitive to possible positional variations and changes in position. The other two action bearings had to be designed as before, as fixed bearings without the possibility of compensating positional variations and changes in position, in order to guarantee secure mounting of the action in an invariable location.

An action mounting designed according to this principle for a recoilless air rifle is illustrated and described in German Offenlegungsschrift No. 2,512,476. In this publication, in a similar way to the above mentioned compressed-air firearm according to German Patent Specification No. 1,147,142, the action is mounted so as to be longitudinally displaceable in the rifle stock by means of three cylindrical bearings bolts arranged parallel to one another. Two of the three bearing bolts at the front and rear ends of the breech casing are guided displaceably in metallic prismatic guide grooves. The third bearing bolt is supported on a flat horizontal in the position of use of the firearm and therefore undergoes no lateral guidance. To ensure that the action rests securely in the open bearings, it is pressed down by springs as well as by its own weight, or the bearing bolts are pressed into the bearings by means of small plastic blocks, the pressing force being variable by means of adjusting screws.

In this construction, the problem of compensating the positional variations is solved only partially for the one bearing with the flat supporting plate. However, even here, a positional variation, caused because the supporting plate and the bearing bolt are not parallel, cannot be eliminated and results in an undesirable edge pressure. It is also unfavorable that all three bearings have to be loaded by additional holding-down forces, thus increasing the friction and wear.

BRIEF SUMMARY OF THE INVENTION

The object of this invention is to design all bearings for the displaceable action of a recoilless competition firearm so that dimensional and positional variations caused by production are compensated automatically and yet the action is guided securely and stably.

This object is achieved, according to the invention, by the fact that the bearings have beddings which are reversibly deformable or deformable once permanently and which can be loaded in different directions.

The use of one type of bedding does not necessarily excluded the other type of bedding. Both can be used very advantageously together, so that a bearing has two beddings, one of which is reversibly deformable and the other is deformable once permanently.

Bearings with a reversible deformable bedding not only adapt themselves to dimensional and positional variations caused by production which are constant in amount and direction, but also advantageously permit, to a certain extent, compensation for changes in position which arise as a result of external and operation causes.

Beddings of the other type, which are permanently deformable exclusively during installation, are suitable only for compensating pre-existing dimensional and positional variations caused by production. However, for this reason, they have the advantage that, after final shaping, they do not endeavour to reform elastically to a different shape. Because of this, there are no additional forces on the bearings.

It is also possible to make beddings of a material such as, for example, silicone rubber, which is first doughy for the purpose of initial shaping and then polymerises more or less elastically depending on the mixing ratio of its components. A bedding of this type has the advantageous properties of both types of bedding described above.

For reversible deformable beddings which are fixed and ready before installation, an elastic synthetic polymer is especially suitable as the material. Since such materials frequently also have good sliding properties, a bedding made therefrom could directly constitute the load-bearing body in the case of plain bearings.

If ball bearings are used, it is advisable to make at least the rolling bodies of an elastic plastic, so that the bearing no longer has the rigidity of an all-metal bearing.

Beddings which essentially must have no elastic properties and acquire their final permanent shape during installation can consist of materials which are initially liquid or doughy and which harden in situ after being introduced. A suitable adhesive can be considered, for example, for this purpose, provided that the dimensional and positional variations are relatively small, and the bedding may be thin-walled. As a result of the use of adhesive, a firm permanent connection of the bearing to the supporting constructional part is also guaranteed at the same time. An alternative would be a kneadable and hardenable synthetic resin/cement compound which is especially suitable for beddings having thicker walls.

Some exemplary embodiment of the invention are illustrated in the drawings and are described in more detail below.

BRIEF DESCRIPTION OF THE DRAWINGS

FIG. 1 shows an elevational view partly in section of a competition rifle with an action mounted so as to be longitudinally displaceable;

FIG. 2 shows an elevational view partly in section of a competition rifle similar to that of FIG. 1, with another arrangement of the action bearings.

DETAILED DESCRIPTION

Figure 3:
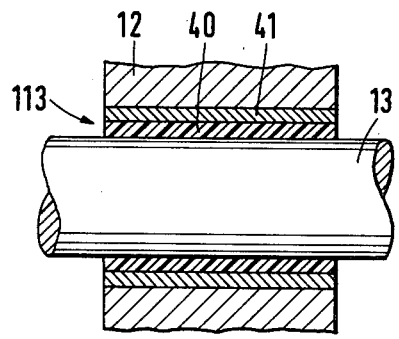
FIGS. 3, 4 and 5 show cross-sectional views, on an enlarged scale, of three different embodiments of action bearings.

FIG. 1 shows a competition rifle which consists of a stock 1, a trigger guard 2, a cylindrical rifle sleeve 3 or breech housing, with a barrel casing tube 4 extending forwards along the same main axis, and an action 5. The trigger guard 2 and the rifle sleeve 3 or breech housing, are connected fixedly to the stock 1.

The action 5 consists of a cylindrical breech casing 6 with a breech or compression mechanism (not shown) located therein. A barrel 7 and a trigger mechanism 8 are mounted on the breech casing 6 so as to be longitudinally displaceable together with the breech casing in the rifle sleeve 3 and the barrel casing tube 4. Altogether, there are three bearings for mounting the action 5, namely a bearing 9 and 10 at each of the two ends of the barrel casing tube 4 and a bearing 11 located in a bearing block 12 arranged between the stock 1 and the rifle sleeve 3. The bearing 11 receives and supports axially displaceably a bolt or pin member 13 which is fastened to the trigger mechanism 8 and which extends parallel to the longitudinal axis of the action 5. As a result of the off-center arrangement of the bearing 11, the action 5 is prevented from rotating with respect to the stock. The three bearings 9, 10 and 11 have beddings which will be explained in more detail later with reference to FIGS. 3 to 5.

The competition rifle illustrated in FIG. 2 has a stock 21 with a trigger guard 22, and an action 25 which is mounted so as to be longitudinally displaceable on the stock 21. The action 25 consists of a breech casing 26 containing a breech or compression mechanism (not shown) and also has a barrel 27 and a trigger mechanism 28, both fastened to the breech casing 26.

In the region of the front or barrel end of the stock 21 there is a recess 30, on the bottom face of which is located a bedding 31 for a two-legged bearing clamp 32. The bedding 31 consists of a synthetic foam material of medium hardness glued both to the bottom of the recess 30 and to the bearing clamp 32 at the interface therewith. Fastened next to one another in the bearing clamp 32 are two cylindrical bearing bolts or pins 33, the longitudinal axes of which are aligned parallel to one another and to the longitudinal axis of the action 25. In FIG. 2, only one of the two bearing bolts 32 can be seen, because the second is concealed by the first. A front support 34, has two bores axially aligned with the respective bearing bolts 33, and is fastened to the breech casing 26 to support the action displaceably on the two bearing bolts 33 by means of two bearings 35 inserted into the two bores and receiving the bearing bolts. This arrangement consisting of the parts 31 to 35 is the mounting for the action on the same end as the barrel and includes a bedding for the bearing 35.

The mounting for the action on the same end as the trigger includes a bearing bolt or pin 36 which is fastened rigidly in the trigger guard 22 and which extends parallel to the longitudinal axis of the action. A rearward support 37 is fastened near the end of the breech casing to support the action by means of a bore through the support and a bearing 38 inserted into the bore to receive the bearing bolt 36 for relative longitudinal displacement. The bearing 38 has a bedding which is described in more detail below with reference to FIGS. 3 to 5.

In FIGS. 1 and 2, the actions 5 and 25 respectively are both shown in their position of readiness for firing. During firing, they slide back in their bearings as a result of the recoil and come to a stop as a result of bearing friction or are braked gently by a buffer not shown.

Figure 4:
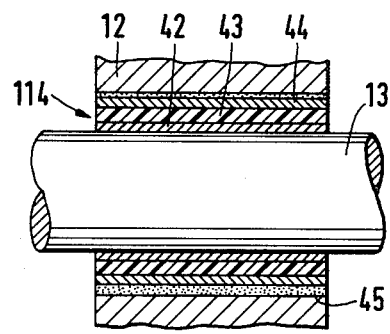
Figure 5:
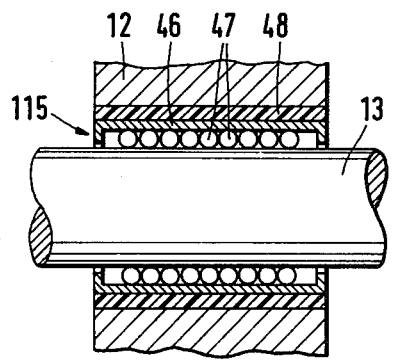

FIGS. 3, 4 and 5 illustrate three alternative forms of an action mounting which can be either of the system bearings indicated in FIGS. 1 and 2, that is to say, for example, either one of the bearings shown at 9, 10 or 11 in FIG. 1, or 35 and 38 in FIG. 2. The bearing 11 in FIG. 1 is taken as an example for describing FIGS. 3 to 5, and this bearing is located in the bearing block 12 and supports the cylindrical bolt 13 fastened to the trigger mechanism 8. The three different bearing designs of the bearing 11 in FIGS. 3 to 5 are identified by 113, 114 and 115 to correspond to the number of the particular FIG. FIG 3 shows an action mounting in which the bearing 113 is a cylindrical bedding 40 serving as a plain-bearing bushing and a steel casing sleeve 41 surrounding it and connected fixedly to it. The casing sleeve 41 is itself pressed into a bore in the bearing block 12. Polytetrafluoroethylene is provided as a material for the plain-bearing bushing and bedding 40, this being a plastic which not only has very good sliding properties, but is also especially elastic. Because of its great elasticity it is possible to eliminate the bearing play by an appropriate choice of the diameters of the bedding 40 and of the bolt 13 guided displaceably therein. In spite of this, the friction forces in the bearing do not become substantially greater as a result. In the bedding 40 there can be recesses, such as grooves on the inner surface for example, not shown and known per se, which serve as receptacles for lubricant and which increase the elasticity of this component.

FIG. 4 illustrates a cylindrical bearing 114 which is composed of a plain-bearing bushing 42 made of tin bronze, an elastic bedding 43 made of plastic material and a steel casing sleeve 44. The individual components of the bearing 114 are connected firmly to one another, for example by gluing. Clearances, recesses or grooves (not shown) can be provided in the bedding 43, to create expansion spaces for the elastic plastic.

Arranged round the cylindrical bearing 114 is a further bedding 45 which consists of a hardened adhesive and the thickness of which is shown not only exaggeratedly, but also unevenly. The thickness of the bedding 45 is greater at the bottom than at the top, this being attributable to the fact that a deviation from the nominal position exists in the form of an eccentricity between the casing sleeve 44 and the bore of the bearing block 12.

FIG. 5 shows a bearing 115 which is designed as a cylindrical linear ball bearing. It has a sleeveshaped steel housing 46 in which a plurality of spherical rolling bodies 47 within a cage (not shown) is arranged. The rolling bodies 47 respectively form various chains closed in the form of a loop, which revolve into one another when the bearing is in operation, the rolling bodies 47 not being loaded on the return travel. An elastic bedding 48 made of plastic is located and fastened between the steel housing 46 and the bearing-receiving bore of the bearing block 12 which is larger in diameter. This bedding 48 can, like the beddings 40 and 43 described above, have clearances, recesses or grooves to increase its elasticity.

We claim:

1. In a competition firearm having a stock, a trigger guard attached to said stock, a breech casing having inner and outer ends and a barrel attached to the breech casing outer end, said breech casing and barrel being mounted and guided in the firearm on a plurality of bearing assemblies so that they are displaceable in the direction of the longitudinal axis of the firearm, the improvement wherein the bearing assemblies each comprise deformable beddings to allow alignment of the axes of said bearing assemblies with the axes of said displaceably mounted parts, and at least one bearing assembly comprises an inner bedding and an outer bedding disposed radially outwardly with respect to said inner bedding so that said inner bedding is inside said outer bedding, one of said inner and outer beddings being reversibly deformable and the other of said inner and outer beddings being deformable once permanently.

2. The improvement in a firearm as claimed in claim 1 wherein said bearing assemblies comprise bearings mounted within said beddings.

3. The improvement in a firearm as claimed in claim 1 and further comprising a breech housing having an inner and an outer end mounted on said stock enclosing said breech casing and being longer than said breech casing to accommodate the longitudinal displacement of the breech casing during firing, a barrel casing extending from the outer end of said breech housing and enclosing said barrel, a hollow chamber in said stock, a slot in said breech housing communicating with said chamber, and a trigger mechanism mounted on said breech casing and extending through said slot into said chamber, said chamber and slot being larger than said trigger mechanism to accommodate longitudinal displacement thereof, a first bearing assembly between the barrel and the barrel casing at the inner end thereof adjacent said breech housing, a second bearing assembly between the barrel and the barrel casing adjacent the outer end thereof, a bearing block mounted within said chamber between said stock and said breech housing, a third bearing assembly mounted in said bearing block, and an extension attached to said trigger mechanism and cooperatively engaging said third bearing assembly, so that said bearing assemblies guide said breech casing and barrel during said longitudinal displacement.

4. The improvement in a firearm as claimed in claim 3 wherein said first and second bearing assemblies further comprise, cylindrical sleeve-shaped bearings engaging said barrel on their inner surfaces, said third bearing assembly further comprises a cylindrical sleeve-shaped bearing, and said extension on said trigger mechanism is a cylindrical pin engaging within said sleeve-shaped bearing of the third bearing assembly.

5. The improvement in a firearm as claimed in claim 4 wherein each bearing assembly comprises a metallic plain bearing, a cylindrical sleeve comprised of said bedding surrounding said bearing and attached thereto, a metallic casing sleeve surrounding said bedding and attached thereto, and further outer bedding provided in the form of a cylindrical sleeve surrounding said metallic casing sleeve and attached thereto, said outer bedding for said first and second bearing assemblies being attached to said barrel casing and said outer bedding for said third bearing assembly being attached to said bearing block.

6. The improvement in a firearm as claimed in claim 1 and further comprising a front hollow chamber in said stock adjacent the outer end of the breech casing, a rear hollow chamber in said stock near the trigger guard, each chamber being open at the top, a trigger mechanism attached to said breech casing extending into said rear hollow chamber, front and rear bearing support blocks attached to said breech casing and extending into said front and rear chambers respectively, cylindrical elongated pins mounted within said chambers with their longitudinal axes parallel to the longitudinal displacement axis of said breech casing and barrel, and said bearing assemblies being cylindrical and mounted in said bearing support blocks operably engaging said pins to facilitate said longitudinal displacement.

7. The improvement in a firearm as claimed in claim 6 wherein each bearing assembly further comprises a metallic plain bearing engaging said respective pin, a cylindrical sleeve comprised of said inner bedding surrounding said plain bearing and attached thereto, a metallic casing sleeve surrounding said inner bedding and attached thereto, and said outer bedding in the form of a cylindrical sleeve surrounding said metallic casing sleeve and attached thereto and to said bearing support block.

8. The improvement in a firearm as claimed in claim 1 or 2 wherein each said reversibly deformable bedding is comprised of an elastic synthetic polymer.

9. The improvement in a firearm as claimed in claim 1 or 2 wherein each said bedding deformable once permanently is comprised of a synthetic adhesive.

10. The improvement in a firearm as claimed in claim 9 wherein said adhesive comprises a kneedable and hardenable synthetic resin cement.

* * * * *